United States Patent
Ohkawa et al.

(10) Patent No.: US 6,645,875 B2
(45) Date of Patent: Nov. 11, 2003

(54) METHOD OF PROCESSING METAL AND METHOD OF MANUFACTURING SEMICONDUCTOR DEVICE USING THE METAL

(75) Inventors: Makoto Ohkawa, Kariya (JP); Takayuki Sugisaka, Okazaki (JP); Shuichi Ito, Kariya (JP); Hiroshi Tanaka, Toyokawa (JP)

(73) Assignee: Denso Corporation, Kariya (JP)

( * ) Notice: Subject to any disclaimer, the term of this patent is extended or adjusted under 35 U.S.C. 154(b) by 20 days.

(21) Appl. No.: 09/824,726

(22) Filed: Apr. 4, 2001

(65) Prior Publication Data

US 2001/0029080 A1 Oct. 11, 2001

(30) Foreign Application Priority Data

Apr. 6, 2000 (JP) ........................................ 2000-105285

(51) Int. Cl.$^7$ ............................................. H01L 21/302
(52) U.S. Cl. ...................... 438/745; 438/238; 438/314; 438/329; 438/384; 438/643; 438/648; 438/749
(58) Field of Search ................................ 438/309, 238, 438/311, 312, 314, 318, 326, 329, 330, 377, 381, 382, 384, 582, 625, 627, 643, 648, 653, 656, 714, 720, 734, 745, 749, 754, 751; 257/576, 577

(56) References Cited

U.S. PATENT DOCUMENTS

| 4,443,295 A | 4/1984 | Radigan et al. |
| 4,878,770 A | * 11/1989 | Ruggierio et al. .......... 338/307 |
| 5,043,295 A | 8/1991 | Ruggerio et al. |
| 5,989,970 A | 11/1999 | Ohkawa et al. |
| 6,279,585 B1 | 8/2001 | Shiraki et al. |
| 2002/0115299 A1 | * 8/2002 | Ito et al. ..................... 438/704 |

FOREIGN PATENT DOCUMENTS

| JP | A-10-56007 | 2/1998 |
| JP | A-2000-49288 | 2/2000 |
| JP | A-2000-49294 | 2/2000 |
| JP | A-2000-114464 | 4/2000 |
| JP | A-2000-150459 | 5/2000 |
| JP | A-2001-24154 | 1/2001 |

OTHER PUBLICATIONS

U.S. application Ser. No. 09/361,990, Ito, filed Jul. 28, 1999.

* cited by examiner

Primary Examiner—Jack Chen
(74) Attorney, Agent, or Firm—Posz & Bethards, PLC

(57) ABSTRACT

When a barrier metal disposed on a thin film resistor material is wet-etched to expose the underlying thin film resistor material as a thin film resistor, the wet etching is performed at first and second steps. The first step is performed using $H_2O_2/NH_4OH$ solution, and is stopped before the thin film resistor material is exposed. Then, the second step is performed using $H_2O_2/H_2O$ solution until the thin film resistor material is exposed with a desired length, thereby forming the thin film resistor.

8 Claims, 9 Drawing Sheets

METHOD OF PROCESSING METAL AND METHOD OF MANUFACTURING SEMICONDUCTOR DEVICE USING THE METAL

CROSS REFERENCE TO RELATED APPLICATION

This application is based upon and claims the benefit of Japanese Patent Applications No. 2000-105285 filed on Apr. 6, 2000, the contents of which are incorporated herein by reference.

BACKGROUND OF THE INVENTION

1. Field of the Invention

This invention relates generally to a method of processing metal, particularly suitable to process high melting point metal containing at least one of W and Ti, and to a method of manufacturing a semiconductor device using such metal.

2. Description of the Related Art

A thin film resistor made of CrSi or the like is formed on a semiconductor substrate to provide a desired value of resistance. This thin film resistor adopts, as an electrode structure, a structure of thin film resistor/barrier metal/Al wiring member in which the barrier metal made of high melting point metal containing at least one of W and Ti is sandwiched between the thin film resistor and the Al wiring member so as to prevent decrease in allowable current due to mutual diffusion between the thin film resistor and the Al wiring member.

SUMMARY OF THE INVENTION

FIGS. 9A and 9B show steps in a process for manufacturing a semiconductor device having a thin film resistor. FIG. 9A shows a state obtained through several steps, in which a thin film resistor J3 is patterned on an insulating film (oxide film) J2 provided on a silicon layer J1a of a SOI (Silicon On Insulator) wafer J1, and a barrier metal J4 is patterned on the thin film resistor J3. Al wiring members J5 are further formed on both ends of a stack of the thin film resistor J3 and the barrier metal J4, and on the oxide film J2. Photoresist J6 is deposited with an opening exposing the central portion of the barrier metal J4.

Next, as shown in FIG. 9B, the barrier metal J4 is etched to expose the thin film resistor J3. After that, although it is not shown, an interlayer insulating film and an Al thin film layer are formed and patterned, and then a protective film is formed. As a result, the semiconductor device is completed.

The etching of the barrier metal J4 shown in FIG. 9B is generally wet etching that uses, as an etching solution, hydrogen peroxide water ($H_2O_2/H_2O$ solution) or a solution containing hydrogen peroxide water mixed with alkali such as ammonia ($H_2O_2/NH_4OH$ solution). Here, $H_2O_2/NH_4OH$ solution is more generally used because it allows stable etching even when the barrier metal J4 has a somewhat damaged layer in a surface portion thereof and it contains no metallic ion that affects characteristics of a transistor formed in the semiconductor device.

However, if the surface of the thin film resistor J3 is exposed to $H_2O_2/NH_4OH$ solution during the etching, local current paths are formed between the thin film resistor J3 and the barrier metal J4 to cause a cell reaction locally. This is because the ionization tendency of the thin film resistor J3 is different from that of the barrier metal J4 and $H_2O_2/NH_4OH$ solution exhibits high electrical conductivity.

If once the cell reaction occurs, the etching rapidly progresses in the lateral direction of the barrier metal J4. This prevents the processing dimension (dimension between both barrier metal end portions) from being determined stably. Further, as indicated by arrows A in FIG. 9B, the barrier metal J4 may be excessively etched (over-etched) in the lateral direction at the portions under the Al wiring members J5. In this case, the interlayer insulating layer is difficult to fill the over-etched portions of the barrier metal J4, and it may produce vacancies in the over-etched portions. If the vacancies exist, the semiconductor device would have deficiencies such as water invading into the vacancies.

On the other hand, when $H_2O_2/H_2O$ solution containing no alkali is used, because its electrical conductivity is smaller than that of $H_2O_2/NH_4OH$ solution, etching is prevented from rapidly progressing. However, if the surface portion of the barrier metal J4 is damaged and oxidized during the manufacturing process to have a transformed layer, the etching using $H_2O_2/H_2O$ solution is practically difficult.

The present invention has been made in view of the above problems. An object of the present invention is to provide a method for processing a metal with high accuracy in case where different metals contact each other, and particularly a method for processing high melting point metal containing at least one of W and Ti with high accuracy.

According to the present invention, when a second metal overlying a first metal is wet-etched to expose the first metal, the wet etching is performed at first and second etching steps respectively using a first etching solution having a first electrical conductivity and a second etching solution having a second electrical conductivity smaller than the first electrical conductivity. The first etching step is performed using the first etching solution before the second etching step is performed using the second etching solution.

That is, the second etching solution having the smaller electrical conductivity is used when the first metal is exposed during the wet etching. As a result, a cell reaction can be prevented from occurring between the first metal and the second metal, and the etching can be prevented from rapidly progressing. The second metal can be processed (etched) securely with high accuracy.

BRIEF DESCRIPTION OF THE DRAWINGS

Other features of the present invention will become more readily apparent from a better understanding of the preferred embodiments described below with reference to the following drawings, in which.

DETAILED DESCRIPTION OF THE PREFERRED EMBODIMENTS

Hereinafter, preferred embodiments of the invention are explained with reference to appended drawings.

(First Embodiment)

Figure 1:
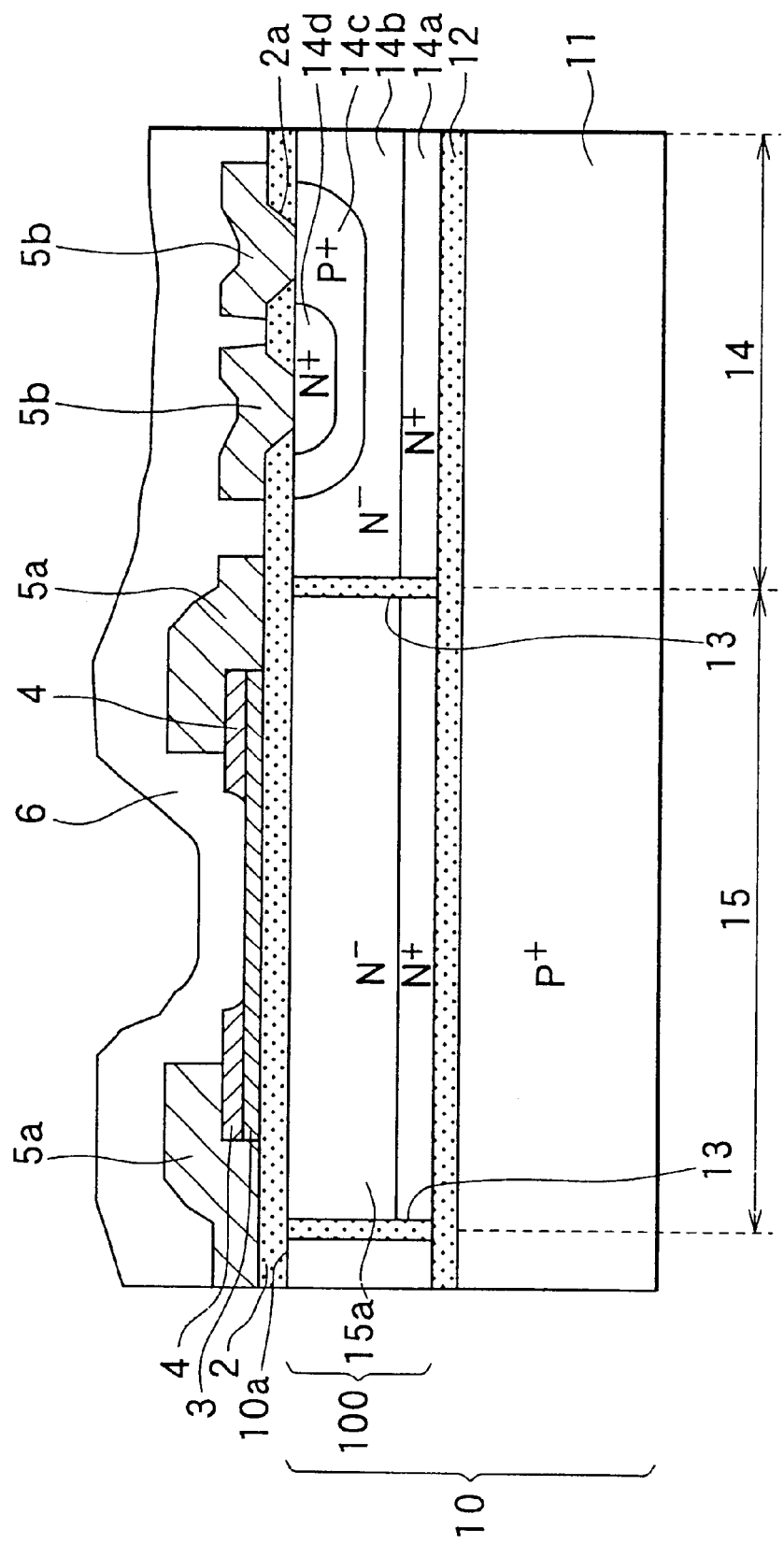
FIG. 1 is a cross-sectional view showing a semiconductor device having a thin film resistor according to a first preferred embodiment of the invention.

A semiconductor device including a thin film resistor according to a first embodiment shown in FIG. 1 has a semiconductor substrate 10 with an SOI structure that is composed of a silicon oxide film 12 disposed on a p type substrate 11, and an activated layer 100 disposed on the silicon oxide film 12. The activated layer 100 is formed from a surface 10a of the semiconductor substrate 10 toward the silicon oxide film 12, and is divided into a device (transistor) formation region 14 and a thin film resistor formation region 15 by an isolation groove 13 filled with a silicon oxide film.

At the device formation region 14, a high impurity concentration n type layer 14a and a low impurity concentration n type layer 14b are formed on the silicon oxide film 12. A p type base region 14c and an n type emitter region 14d are formed in a surface portion of the n type layer 14b, thereby forming a transistor. An insulating film 2 such as a BPSG film containing boron (B) and phosphorus (P) is deposited above the semiconductor substrate 10. The insulating film 2 has contact holes 2a on the transistor at the device formation region, and Al wiring members 5b are electrically connected to the transistor through the contact holes 2a.

At the thin film resistor formation region 15, a high impurity concentration n type layer and a low impurity concentration n type layer 15a are provided on the silicon oxide film 12. The insulating film 2 also overlies the semiconductor substrate 10 at the thin film resistor formation region 15, and a metallic thin film resistor (first metal) 3 is formed on the insulating film 2. The thin film resistor 3 is made of, for example, CrSi, NiCr, TaN, or NiCo. Barrier metal (second metal) 4 is disposed on both end portions of the thin film resistor 3. The barrier metal 4 is made of high melting point metal containing at least one of W and Ti, and is made of TiW in this embodiment. Further, Al electrodes 5a are disposed on the thin film resistor 3 through the barrier metal 4. Then, these thin film resistor 3, barrier metal 4, Al electrodes 5a, and Al wiring members 5b are covered with a protective film 6 such as a TEOS film. The semiconductor device is constructed as mentioned above.

Next, a method for manufacturing the semiconductor device shown in FIG. 1 is explained with reference to FIGS. 2A through 4B.

Figure 2A:
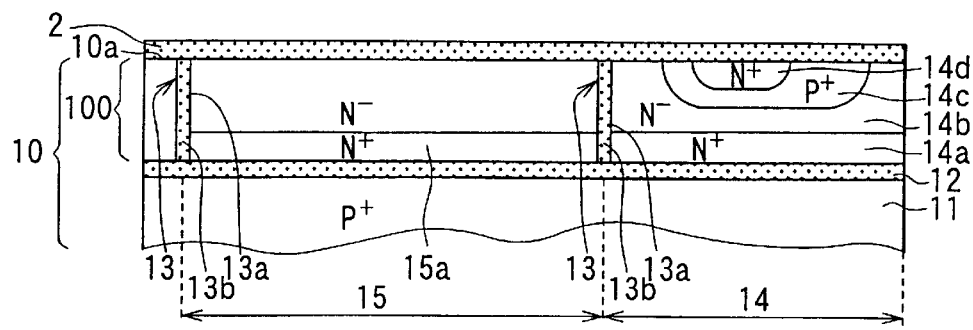
FIGS. 2A to 2C, 3A to 3C, 4A, and 4B are cross-sectional views showing a method for manufacturing the semiconductor device in a stepwise manner in the first embodiment.

[Step shown in FIG. 2A]

First, the semiconductor substrate 10 having an SOI structure is prepared. A groove 13a is formed on the surface 10a of the substrate, and an oxide film 13b is embedded in the groove 13a to form the isolation groove 13. The activated layer 100 of the semiconductor substrate 10 is accordingly divided by the groove 13 into the device formation region 14 and the thin film resistor formation region 15.

Next, at the device formation region 14, the transistor having the p type base region 14c and the n type emitter region 14d is formed in the surface portion of the upper low impurity concentration n type layer 14b. The lower high impurity concentration n type layer 14a works as an embedded collector layer in the transistor. Then, the insulating film 2 is formed uniformly on the surface 10 of the semiconductor substrate 10 by plasma enhanced CVD, atmospheric pressure CVD, thermal oxidation, or the like.

Figure 2B:
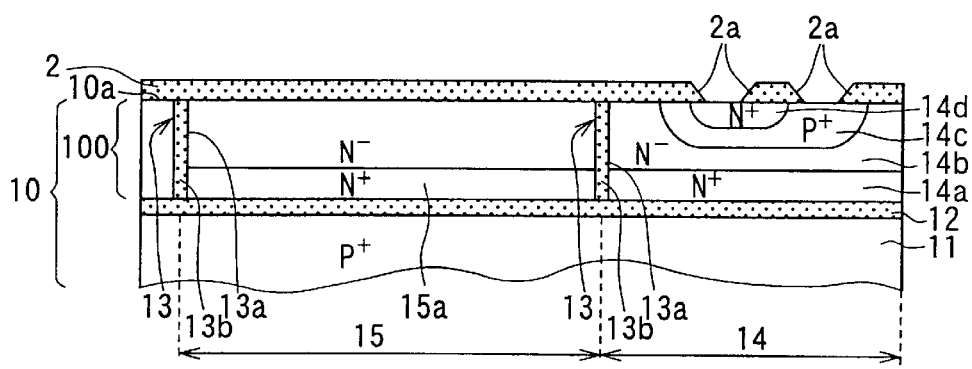

[Step shown in FIG. 2B]

The contact holes 2a are formed in the insulating film 2 through a photolithography step for providing electrical connection with the transistor.

Figure 2C:
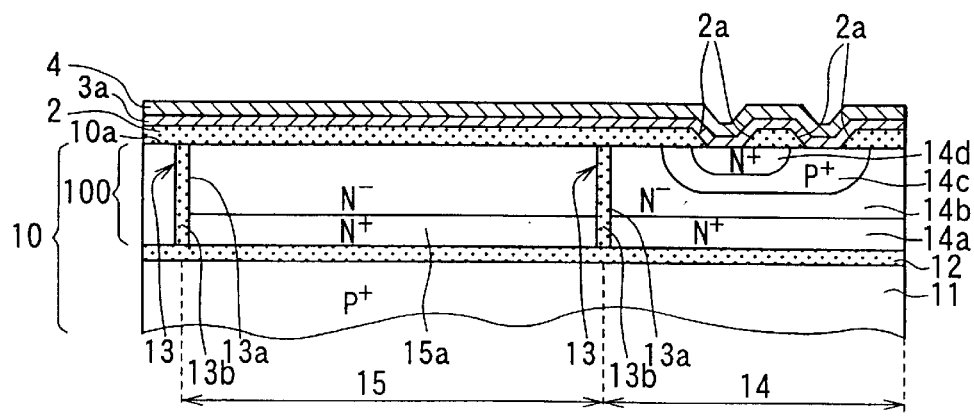

[Step shown in FIG. 2C]

Thin film resistor material 3a made of CrSi, NiCr or others is deposited by a sputtering method to have a thickness of about 15 nm, and then the barrier metal 4 made of TiW is deposited to have a thickness of about 150 nm.

Figure 3A:
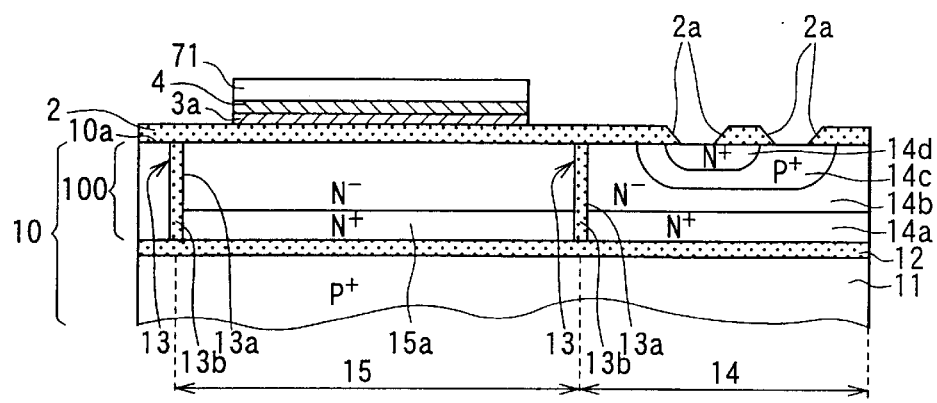

[Step shown in FIG. 3A]

The barrier metal 4 is wet-etched with an etching solution containing $H_2O_2$ and a mask of photoresist 71. Further, the thin film resistor material 3a is dry-etched using gas such as $CF_4$, and a mask composed of the photoresist 71 and the patterned barrier metal 4 so that the thin film resistor material 3a is patterned. Incidentally, the barrier metal 4 and the thin film resistor material 3a may be dry-etched using gas such as $CF_4$ simultaneously.

Figure 3B:
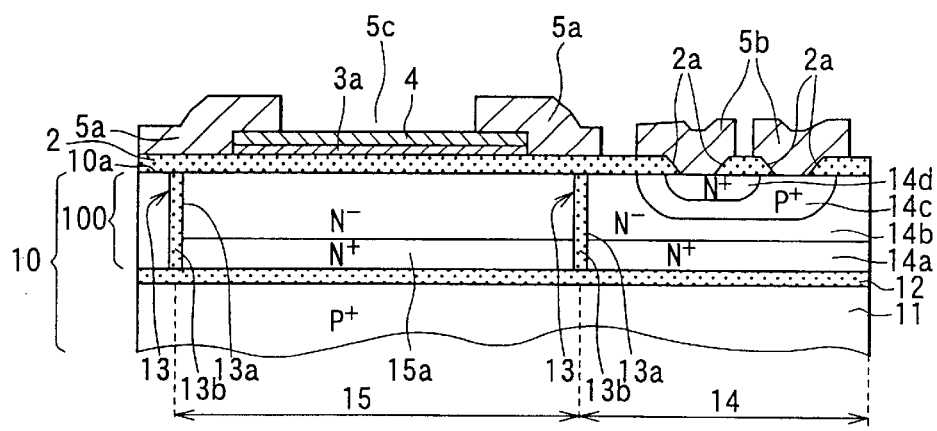

[Step shown in FIG. 3B]

After the photoresist 71 is removed, an Al film made of Al or AlSi as an electrode material is formed on the entire surface to have a thickness of about 1.0 µm. Successively, etching is performed using photoresist as a mask to pattern the Al film. Accordingly, the Al electrodes 5a for connection with the thin film resistor 3 and the Al wiring members 5b for the transistor are formed simultaneously. It is noted that the patterning of the Al film is performed by dry etching using gas containing chlorine in view of excellent processing accuracy.

At this step, the Al film above the patterned barrier metal 4 is removed so that an opening 5c is formed in the Al film. Incidentally, an oxide film may be formed on the barrier metal 4 when this step is performed in oxidizing atmosphere by etching such as dry etching (resist ashing or the like) including oxide plasma.

Figure 3C:
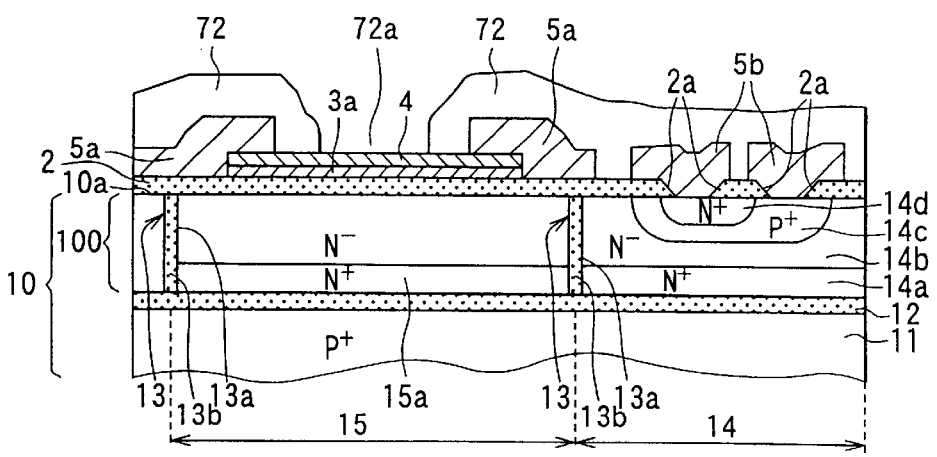

[Step shown in FIG. 3C]

After photoresist 72 is formed uniformly, the photoresist 72 above the barrier metal 4 is removed to have an opening 72a. At this step, as shown in the figure, the Al electrodes 5a formed on the both-end portions of the barrier metal 4 are covered with the photoresist 72 completely to prevent the Al electrodes 5a from being exposed from the opening 72a.

Figure 4A:
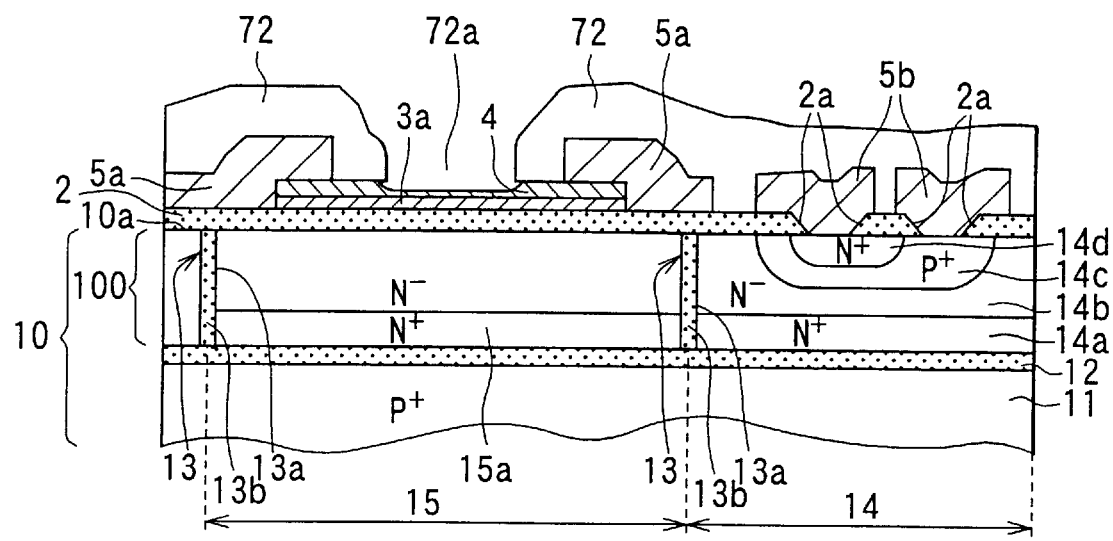

[Step shown in FIG. 4A](First Etching)

The barrier metal 4 is then etched using the photoresist 72 as a mask. An etching solution used at this step is a solution containing hydrogen peroxide water mixed with alkali such as ammonia ($H_2O_2$/$NH_4OH$ solution, first etching solution). Specifically, for instance, 30 wt % aqueous solution of hydrogen peroxide (stock solution) and 29 wt % aqueous solution of ammonia are mixed with each other at a ratio in volume of 100:5, and thus obtained solution is used. The mixing ration may be changed appropriately. $H_2O_2$/$NH_4OH$ solution has a high electrical conductivity because ammonia dissolves therein as alkali.

By the etching using $H_2O_2$/$NH_4OH$ solution, the transformed (damaged) layer, which is formed on the surface of the barrier metal 4 and is difficult to be etched, is removed, and the barrier metal 4 is etched immediately before the thin film resistor material 3a is exposed.

The state where the thin film resistor material 3a is exposed at this step means not the state where the thin film resistor material 3a is exposed through fine holes of the barrier metal 4 but the state where the thin film resistor material 3a is exposed so that current paths are produced between the thin film resistor 3a and the barrier metal 4 both contacting the etching solution. The transformed layer is an oxide film formed at the step shown in FIG. 3B, or a layer formed on the surface of the barrier metal 4 and containing Ti at a high concentration, or the like, and the thickness of the transformed layer is, for example, in a range of about $10 \times 10^{-10}$ to $100 \times 10^{-10}$ m (10 to 100 Å).

Figure 4B:
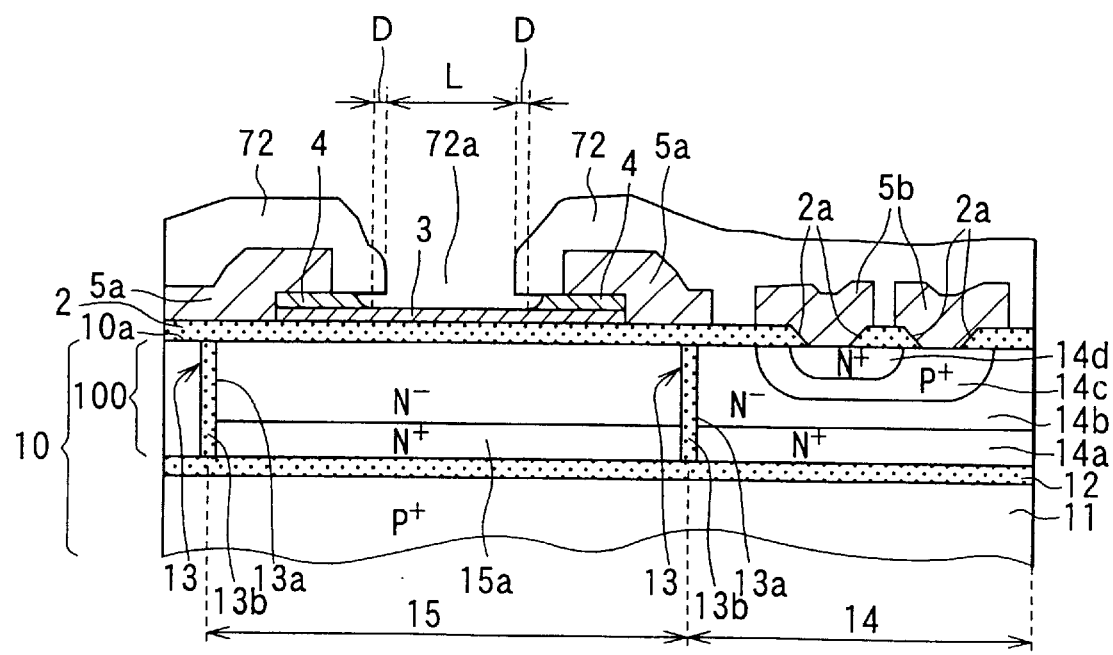

[Step shown in FIG. 4B](Second Etching)

Then, the remaining barrier metal 4 is further etched by hydrogen peroxide water ($H_2O_2/H_2O$ solution, second etching solution). $H_2O_2/H_2O$ solution is mixed with, for example, hydrogen peroxide and water at a ratio of 100:100. Because no alkali is dissolved in $H_2O_2/H_2O$ solution, $H_2O_2/H_2O$ solution has electrical conductivity lower than that of $H_2O_2/NH_4OH$ solution. The etching is performed until the thin film resistor material 3a is exposed with a desired length (area), thereby forming the thin film resistor 3.

Thus, in the state where the barrier metal 4 is exposed, $H_2O_2/H_2O$ solution having lower electrical conductivity is used to prevent the cell reaction caused between the barrier metal 4 and the thin film resistor material 3a, so that the etching is prevented from rapidly progressing. As a result, the barrier metal can be processed securely and accurately to have a desired length.

If the etching of the barrier metal 4 is performed using $H_2O_2/H_2O$ solution from the beginning, the etching rate is too slow especially at the surface portion of the barrier metal 4 that is difficult to be etched. As opposed this, in the present embodiment, the barrier metal 4 is etched using $H_2O_2/NH_4OH$ solution, capable of exhibiting a high etching performance, immediately before the buttery action occurs. Therefore, the decrease in etching rate can be suppressed as small as possible.

After that, the photoresist 72 is removed, and the protective layer 6 and the like are formed. Then, a heat treatment is performed under nitrogen atmosphere at 450° C. for 20 minutes, thereby completing the semiconductor device with the thin film resistor 3.

Thus, the barrier metal 4 is etched at two steps. That is, after the barrier metal 4 is etched using $H_2O_2/NH_4OH$ solution capable of exhibiting high etching performance, it is etched using $H_2O_2/H_2O$ solution having small electrical conductivity. Therefore, the variation in interval between the end portions of the barrier metal 4 remaining on the thin film resistor 3 as a result of patterning, i.e., the variation in dimension of the thin film resistor 3 can be reduced.

Next, accuracies of thin film resistors 3 that were formed by etching the barrier metal 4 at the two steps were experimentally examined, and the results are described below. Specifically, several thin film resistors 3 having different lengths from each other that are used practically on SOI wafers were formed by the two-step etching described above.

In each thin film resistor 3 after etching, referring to FIG. 4B, resistance length L and side-etch amount D were measured. Here, resistance length L is a distance between edge portions of the opening 72a of the photoresist 72 in cross-section, and side-etch amount D is a distance between one of the edge portions of the opening 72a and the end portion of the barrier metal 4 etched at the thin film resistor side. Further, the same experiment was performed to a comparative example formed by a single step etching using only $H_2O_2/NH_4OH$ solution.

Figure 5:
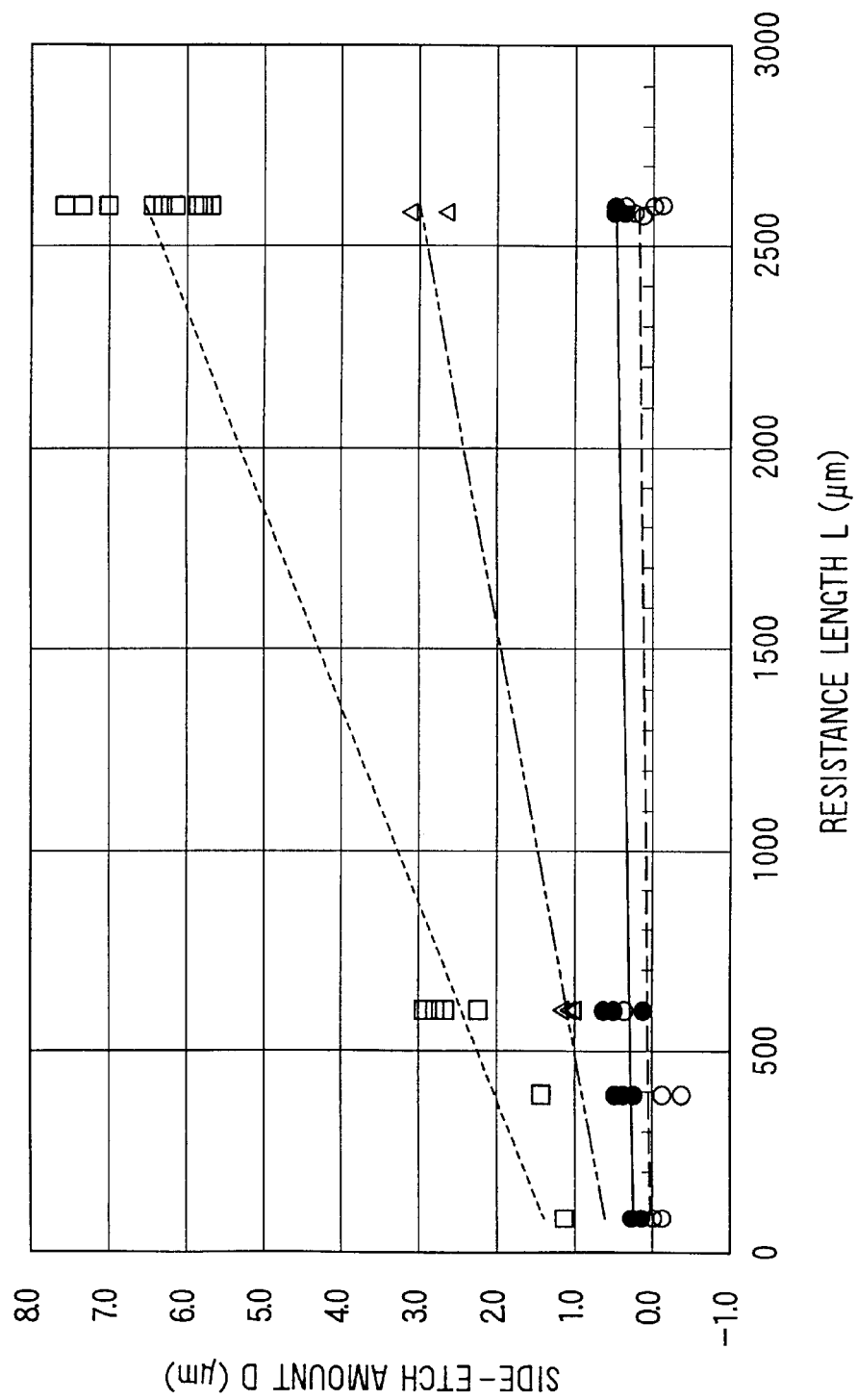
FIG. 5 is a graph showing results comparing the manufacturing method in the first embodiment and a conventional manufacturing method.

FIG. 5 is a graph showing the results, in which a horizontal axis represents resistance length L ($\mu$m) while a vertical axis represents side-etch amount D ($\mu$m). In the graph, mark • shows the result obtained by a first experiment involving the two-step etching as in the present embodiment. Specifically, in the first experiment, after the first etching using $H_2O_2/NH_4OH$ solution was carried out for 1 minute, the second etching using $H_2O_2/H_2O$ solution was carried out for 43 minutes. Mark ○ shows the result obtained by a second experiment involving the two-step etching as in the present embodiment. In the second experiment, after the first etching using $H_2O_2/NH_4OH$ solution was carried out for 1 minute, the second etching using $H_2O_2/H_2O$ solution was carried out for 20 minutes. Marks □ and Δ show the results obtained by the comparative example as described above, and in the comparative example, the etching using only $H_2O_2/NH_4OH$ solution was carried out for 4 minutes. The results indicated by marks □ and Δ were respectively obtained from different wafers on which similar thin film resistors were formed.

As shown in FIG. 5, in the case of the conventional single-step etching only using $H_2O_2/NH_4OH$ solution, the longer the resistance length L becomes, the larger the side-etch amount D becomes. In addition, the variations in side-etch amount D of the thin film resistors having the same resistor length L in the respective wafers are also increased especially when the resistor length L is increased. This implies that there arises variation in shape of the barrier metals for contacting the Al electrodes on one chip. That is, as indicated by the results plotted with marks □ and Δ, the shape of the thin film resistor, i.e., the shape factor of the thin film resistor strongly affects how the cell reaction appears.

Incidentally, although it is not shown, the barrier metal may be etched using the photoresist for patterning the Al film to form the Al electrodes and others. In this case, the Al electrodes are exposed to the etching solution for the barrier metal, and further the side-etch amount D is easily increased because the barrier metal is over-etched under the Al electrodes where the Al electrodes are exposed to the etching solution so as to cause a cell reaction between the Al electrodes and the barrier metal and so as to be etched slightly. As a result, not only the etching mechanism but also the shape determined by the etching is complicated, resulting in large variations in shape of the thin film resistors in one lot, on one wafer, or on one chip. In such a case, it is very difficult to control uniform etching. These variations in shape are mainly caused by the difference in how the cell reaction appears locally while being affected by difference in resistor pattern. However, it is further revealed that these variations are largely affected by the dry etching treatment when the Al film is patterned by the dry etching treatment. It is considered that the reason is because how the local cell reaction appears and how the etching progresses are changed due to a slight difference in surface state (oxidized state, the amount of attached polymer, and the like) of the Al electrodes determined by the dry etching treatment.

Referring back to the graph shown in FIG. 5, while the results indicated with marks □ and Δ were obtained by the identical experiment, there arises a difference in side-etch amount D between the two results. It is considered that this difference is caused by processing variations (errors) occurring in each step to the formation of the thin film resistor on the semiconductor substrate. On the other hand, when the two-step etching is carried out as in the present embodiment, the side-etch amount D hardly changes even when the resistance length L is increased. In addition, the variation in side-etch amount D can be reduced.

The present embodiment adopts $H_2O_2/NH_4OH$ solution and $H_2O_2/H_2O$ solution as etching solutions; however, the etching solutions are not limited to those. It is noted that the first etching should be performed using etching solution capable of exhibiting a high etching performance and having large electrical conductivity, and the second etching should be performed using etching solution having small electrical conductivity.

(Second Embodiment)

The process for forming the thin film resistor 3 by etching the barrier metal 4 at two steps can be applied to various methods for manufacturing semiconductor devices, in addition to the method as explained in the first embodiment. One of the methods is explained as an example in a second embodiment. In comparison with the first embodiment, steps before the barrier metal 4 is etched are different.

FIGS. 6A, 6B, 7A, and 7B show steps for manufacturing the semiconductor device, in which the same parts as those in FIGS. 1 to 4 are designated with the same reference numerals. FIGS. 6A, 6B, 7A, and 7B respectively show, in a stepwise manner, only the thin film resistor formation region 15 that is the feature of the invention.

Figure 6A:
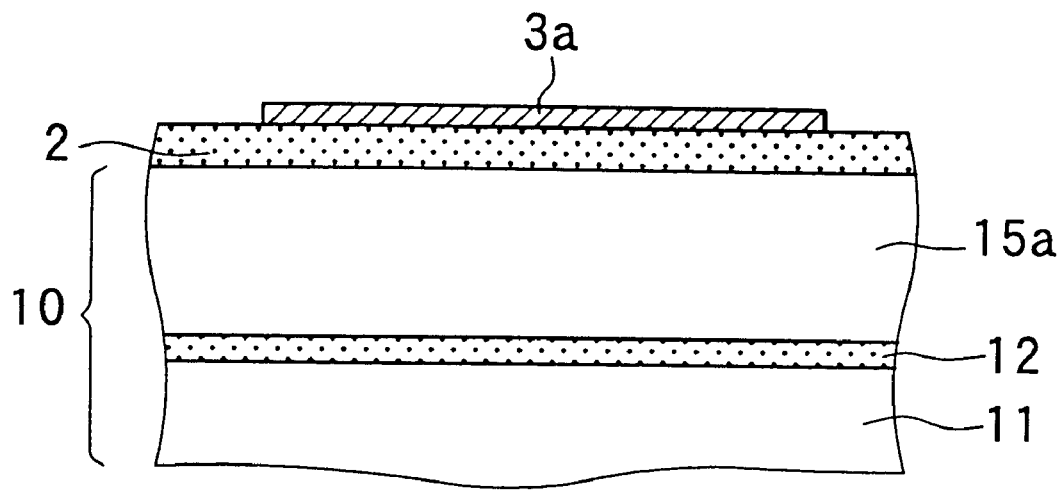
FIGS. 6A, 6B, 7A and 7B are cross-sectional views showing a method for manufacturing the semiconductor device in a stepwise manner according to a second preferred embodiment of the invention.

[Step shown in FIG. 6A]

The insulating film 2 is formed on the semiconductor substrate 10, and the thin film resistor material 3a is formed thereon uniformly. After that, the thin film resistor material 3a is etched with photoresist as a mask, and thus patterned. Then, the photoresist is removed.

Figure 6B:
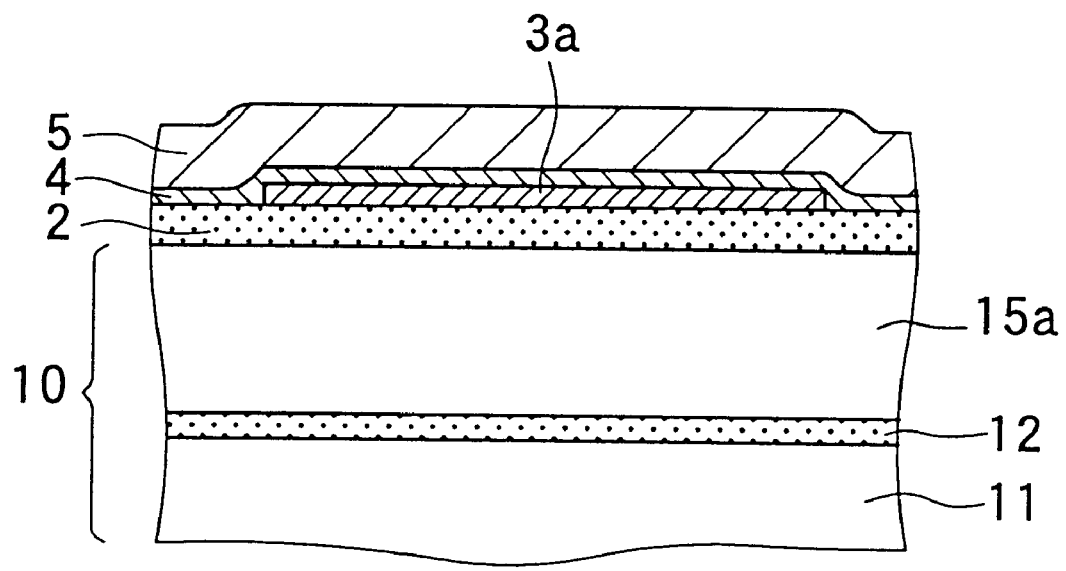

[Step shown in FIG. 6B]

The barrier metal 4 is formed uniformly, and then, the Al film 5 is formed uniformly.

Figure 7A:
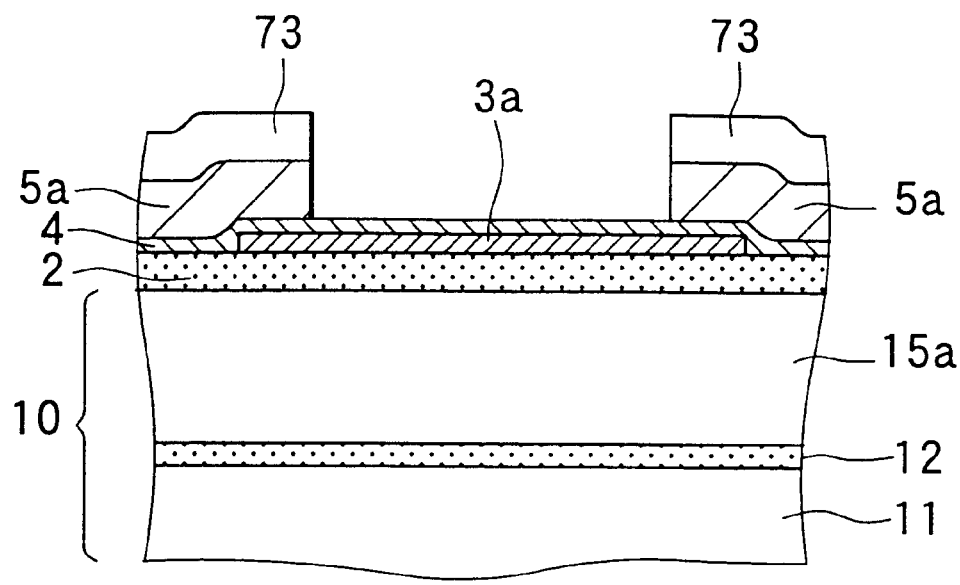

[Step shown in FIG. 7A]

The Al film 5 is etched using photoresist 73 as a mask to be patterned, thereby forming the Al electrodes 5a. The etching may be either dry etching or wet etching.

Figure 7B:
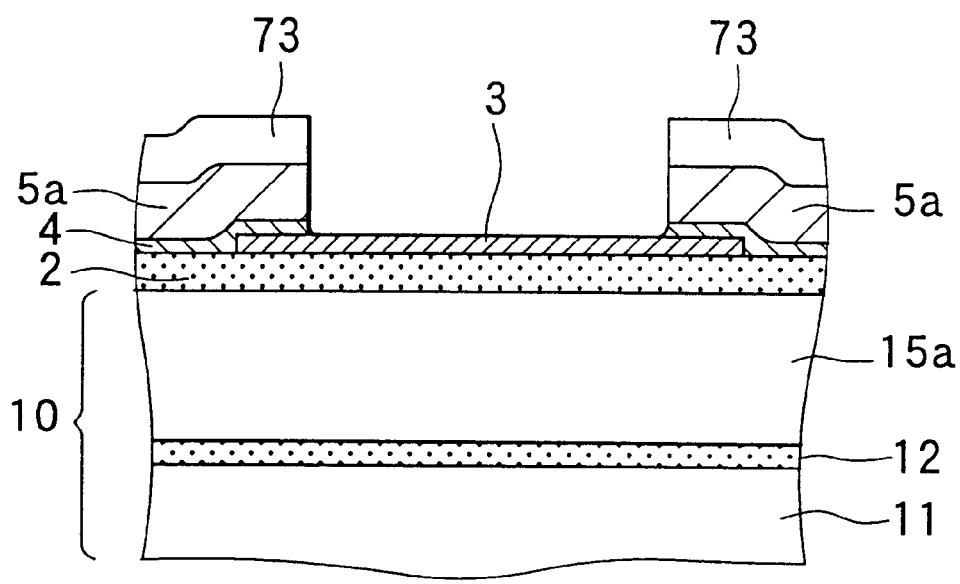

[Step shown in FIG. 7B]

Similarly to the steps shown in FIGS. 4A and 4B, the two-step etching is performed, and accordingly, the thin film resistor 3 is formed. In this case, the Al electrodes 5a work as a mask for patterning the barrier metal 4. After that, the photoresist 73 is removed and the protective film 6 and the like are formed. In consequence, the semiconductor device is completed.

In the present embodiment, although the formation of the Al wiring members 5b at the element formation region 14 is omitted, the step for forming the Al wiring members 5b can be appropriately added in the steps described above. For example, the Al wiring members 5b may be formed before the thin film resistor material 3a is formed and may be covered with a protective film when the thin film resistor material 3a is formed.

Figure 8A:
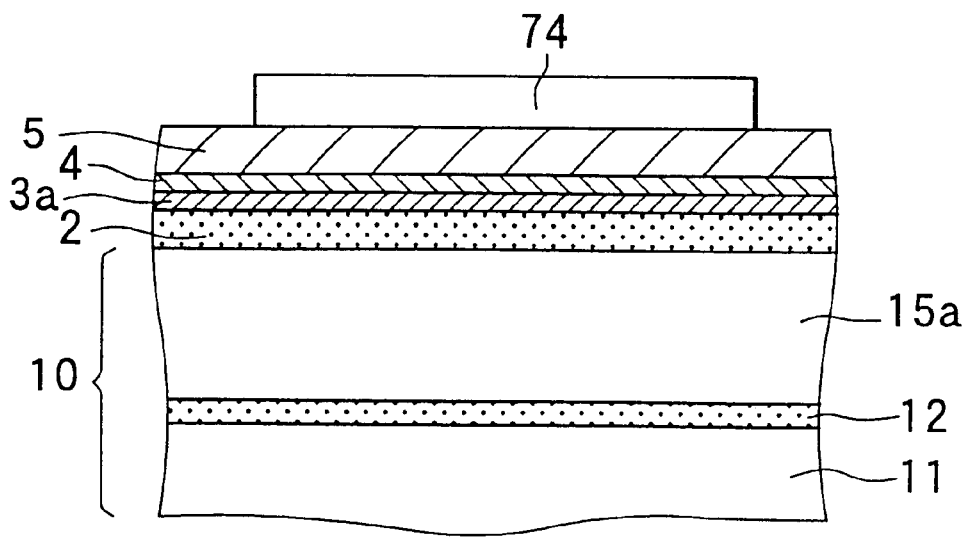
FIGS. 8A and 8B are cross-sectional views showing steps for manufacturing the semiconductor device in a modified embodiment.
Figure 8B:
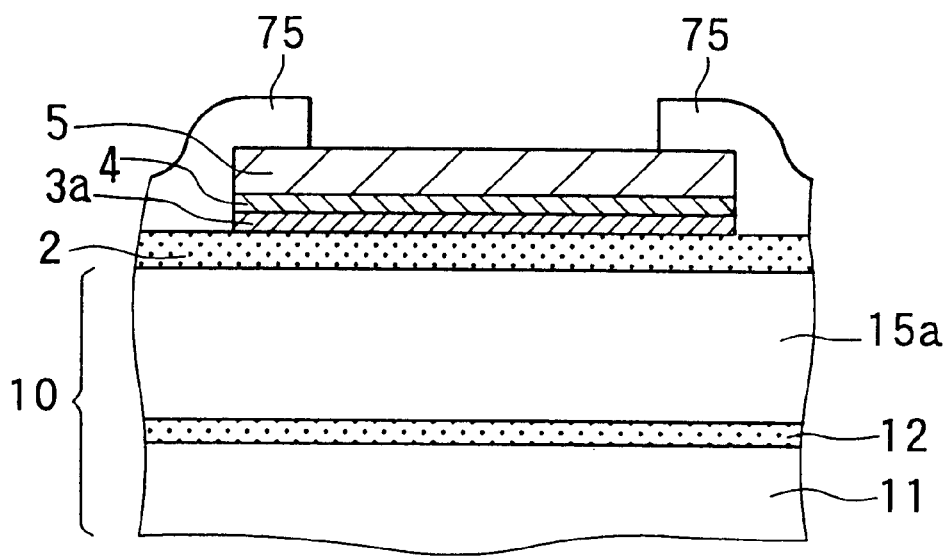
Figure 9A:
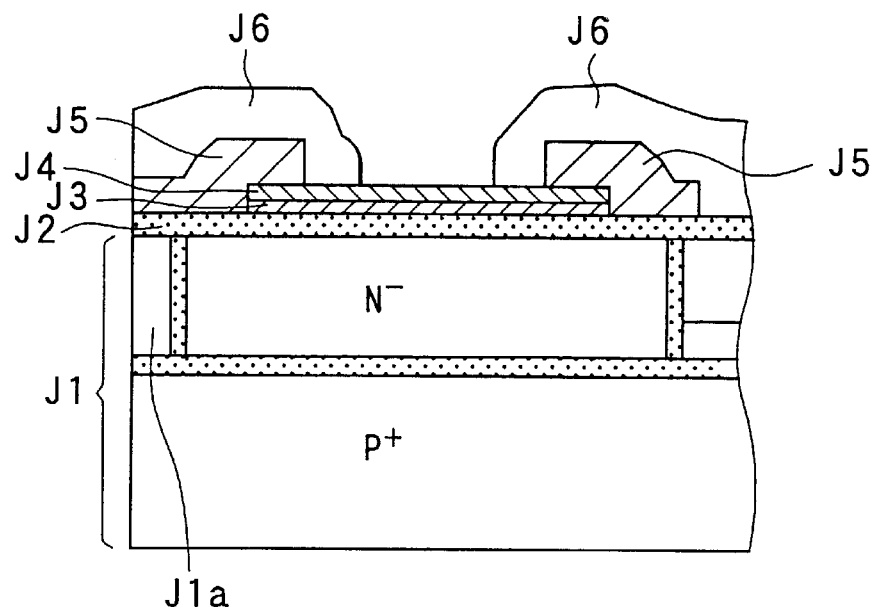
FIGS. 9A and 9B are cross-sectional views showing a method for manufacturing a semiconductor device having a thin film resistor.
Figure 9B:
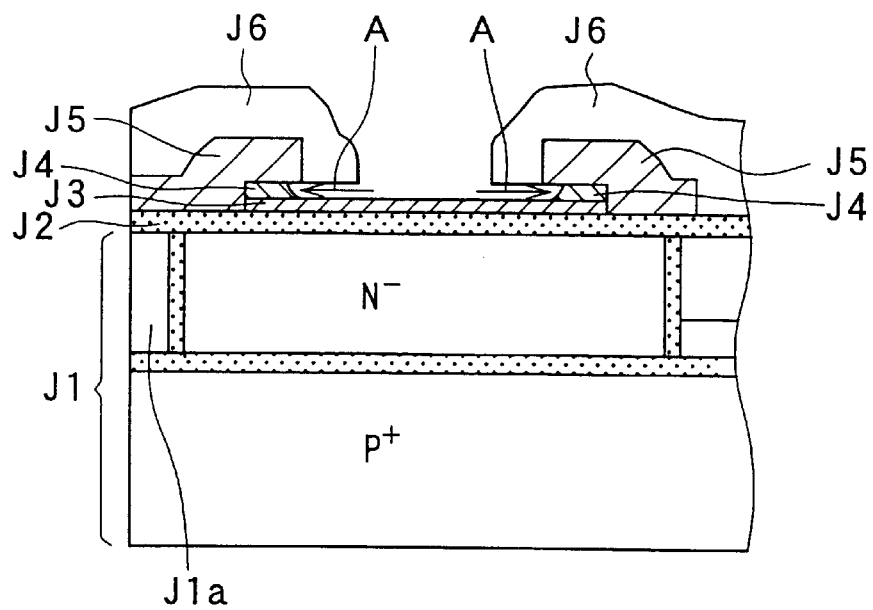

The two-step etching according to the present invention is not limited to the methods in the embodiments described above. For example, the two-step etching may be applied to a method shown in FIGS. 8A and 8B. At a step shown in FIG. 8A, the insulating film 2, the thin film resistor material 3a, the barrier metal 4, and the Al film 5 are successively formed on the semiconductor substrate 10, and the respective thin films 3a, 4, and 5 are patterned simultaneously using photoresist 74 as a mask. After that, as shown in FIG. 8B, the etching of the Al film 5 and the two-step etching of the barrier metal 4 may be carried out using photoresist 75 as a mask. In this case, the etching of the Al film 5 may be either dry etching or wet etching, and it can be appropriately selected in accordance with a required accuracy of the Al film 5.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for processing metal, comprising:

preparing a first metal;

layering a second metal on the first metal, the second metal having an ionization different from that of the first metal; and wet-etching the second metal so that the first metal underlying the second metal is exposed, wherein:
the wet-etching is performed at first and second etching steps respectively using a first etching solution having a first electrical conductivity and a second etching solution having a second electrical conductivity smaller than the first electrical conductivity; and
the first etching step is performed using the first etching solution before the second etching step is performed using the second etching solution.

2. The method according to claim 1, wherein the second metal is a high melting point metal containing at least one of Ti and W.

3. The method according to claim 1, wherein:

the first etching step is performed in a state where no current path is formed between the first metal and the second metal through the first etching solution; and the second etching step is performed in a state where a current path is formed between the first metal and the second metal.

4. The method according to claim 1, wherein:

the second metal has a transformed layer on a surface thereof; and the first etching step is performed to remove the transformed layer and an upper part of the second metal, and is stopped before the first metal is exposed.

5. The method according to claim 1, wherein:

the first etching solution is hydrogen peroxide water including alkali; and the second etching solution is hydrogen peroxide water excluding alkali.

6. A method of processing metal, comprising:

preparing a first metallic layer;

forming a second metallic layer on the first metallic layer, the first metallic layer and the second metallic layer having ionization tendencies different from each other; and removing a region of the second metallic layer by wet etching using an etching solution to exposed the first metallic layer underlying the region, wherein:

an electrical conductivity of the etching solution is decreased at a later part of the wet etching to be smaller than an initial value of the electrical conductivity at an early part of the wet etching; and the first metallic layer is exposed to the etching solution at the later part of the wet etching.

7. The method according to claim 6, wherein the second metallic layer has an ionization tendency larger than that of the first metallic layer.

8. The method according to claim 6, wherein:

a first etching solution having a first electrical conductivity of the initial value is used at the early part of the wet etching; and a second etching solution having a second electrical conductivity smaller than the first electrical conductivity is used at the later part of the wet etching.

* * * * *